(12) United States Patent
Donaton et al.

(10) Patent No.: US 7,498,271 B1
(45) Date of Patent: Mar. 3, 2009

(54) NITROGEN BASED PLASMA PROCESS FOR METAL GATE MOS DEVICE

(75) Inventors: Ricardo A. Donaton, Cortlandt Manor, NY (US); Rashmi Jha, Wappingers Falls, NY (US); Siddarth A. Krishnan, Peekskill, NY (US); Xi Li, Somers, NY (US); Renee T. Mo, Briarcliff Manor, NY (US); Naim Moumen, Walden, NY (US); Wesley C. Natzle, New Paltz, NY (US); Ravikumar Ramachandran, Pleasantville, NY (US); Richard S. Wise, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/145,035

(22) Filed: Jun. 24, 2008

(51) Int. Cl.
*H01L 21/31* (2006.01)

(52) U.S. Cl. .................. 438/775; 438/777; 438/788; 438/709; 438/710

(58) Field of Classification Search ......... 438/474–475, 438/485, 513, 709–710, 788–792, 775–777
See application file for complete search history.

(56) References Cited

U.S. PATENT DOCUMENTS

| 6,872,613 | B1 | 3/2005 | Xiang et al. |
| 7,122,419 | B2 * | 10/2006 | Kim ........................... 438/238 |
| 2004/0067619 | A1 * | 4/2004 | Niimi et al. ................. 438/275 |
| 2005/0269635 | A1 | 12/2005 | Bojarczuk, Jr. et al. |
| 2006/0084229 | A1 * | 4/2006 | Kirkpatrick et al. ......... 438/275 |
| 2006/0138556 | A1 * | 6/2006 | Visokay et al. .............. 257/374 |
| 2007/0114605 | A1 | 5/2007 | Dyer et al. |

\* cited by examiner

*Primary Examiner*—Dung A. Le
(74) *Attorney, Agent, or Firm*—Scully, Scott, Murphy & Presser, P.C.; Todd M.C. Li, Esq.

(57) ABSTRACT

The present invention, in one embodiment, provides a method of forming a gate structure including providing a substrate including a semiconducting device region, a high-k dielectric material present atop the semiconducting device region, and a metal gate conductor atop the high-k dielectric material, applying a photoresist layer atop the metal gate conductor; patterning the photoresist layer to provide an etch mask overlying a portion of the metal gate conductor corresponding to a gate stack; etching the metal gate conductor and the high-k dielectric material selective to the etch mask; and removing the etch mask with a substantially oxygen free nitrogen based plasma.

2 Claims, 3 Drawing Sheets

NITROGEN BASED PLASMA PROCESS FOR METAL GATE MOS DEVICE

The present invention generally relates to microelectronics. In one embodiment, the present invention relates to gate structures in metal oxide semiconductor field effect transistors (MOSFETs).

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type (NMOS and PMOS) transistors are used to fabricate logic and other circuitry.

The source and drain regions of a MOS are typically formed by adding dopants to targeted regions of a semiconductor body on either side of the channel. A gate structure is formed above the channel, having a gate dielectric located over the channel and a gate conductor above the gate dielectric. The gate dielectric is an insulator material, which prevents large leakage currents from flowing into the channel when a voltage is applied to the gate conductor, while allowing such an applied gate voltage to set up a transverse electric field in the channel region in a controllable manner. Conventional MOS transistors typically include a gate dielectric formed by depositing or by growing silicon dioxide ($SiO_2$) or silicon oxynitride (SiON) over a silicon wafer surface, with doped polysilicon formed over the $SiO_2$ to act as the gate conductor.

Continuing trends in semiconductor device manufacturing include reduction in electrical device feature sizes (scaling), as well as improvements in device performance in terms of device switching speed and power consumption. MOS transistor performance may be improved by reducing the distance between the source and the drain regions under the gate conductor of the device, known as the gate or channel length, and by reducing the thickness of the layer of gate dielectric that is formed over the semiconductor surface. However, there are electrical and physical limitations on the extent to which the thickness of $SiO_2$ gate dielectrics can be reduced. For example, thin $SiO_2$ gate dielectrics are prone to gate tunneling leakage currents resulting from direct tunneling of electrons through the thin gate dielectric. In addition, there are conventional limitations on the ability to form thin dielectric films with uniform thickness. Furthermore, thin $SiO_2$ gate dielectric layers provide a poor diffusion barrier to dopants and may allow high boron dopant penetration from the p+ polysilicon gate into the underlying channel region of the semiconductor substrate during fabrication of the source/drain regions.

Recent MOS and CMOS transistor scaling efforts have accordingly focused on high-k dielectric materials having dielectric constants greater than that of $SiO_2$ (e.g., greater than about 3.9), which can be formed in a thicker layer than scaled $SiO_2$, and yet which produce equivalent field effect performance. The relative electrical performance of such high-k dielectric materials is often expressed as equivalent oxide thickness (EOT), because the high-k material layer may be thicker, while still providing the equivalent electrical effect of a much thinner layer of $SiO_2$. Since the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

Hafnium based High-K/Metal Gate stacks are one alternative to SiON/Poly-Si gate stacks. Although high-K dielectrics offer significant scaling with respect to SiON, on account of their higher dielectric constant, the effect of the dielectric constant of these gate stacks is tempered by. the thermodynamically favored growth of a low dielectric constant $SiO_2$-like interface layer between the hafnium based high-k gate dielectric and the silicon based substrate, on which the hafnium based high-k gate dielectric is typically formed.

Apart from the scaling drawback, polysilicon gates of high-k gate dielectrics have also been shown to exhibit "Fermi-level pinning", a phenomenon due to which the threshold voltages for nFETs and pFETs are both high. In order to solve this issue, several groups have proposed a dual-metal gate approach. This approach, however, is beset by the issue of metal gate patterning. To pattern the gate stacks, the photoresist needs to be deposited directly on the metal gate and after development and etching, removed without damaging the gate stack. Photoresist removal is typically performed using an oxygen ash process. The oxygen ash process, however, adds to the thickness of the $SiO_2$-like interface layer by providing oxygen that could flow laterally into the gate stack.

SUMMARY OF THE INVENTION

In one embodiment, the present invention provides a method of forming a gate structure. In one embodiment, the present invention provides a process for removing a photoresist mask from a gate structure using an oxygen free nitrogen based plasma process that produces substantially less carbon residue. In one embodiment, the inventive process removes the photoresist from atop a high-k dielectric material, wherein the method includes:
  providing a substrate including a first conductivity region and a second conductivity region, wherein a high-k dielectric material is present atop the first conductivity region and the second conductivity region;
  applying a photoresist layer atop the first conductivity device region and the second conductivity device region;
  removing a first portion of the photoresist layer to texpose one of the first conductivity region and the second conductivity region, wherein a remaining portion of the photoresist layer remains overlying an other of the first conductivity region and the second conductivity region; and
  applying a nitrogen based plasma to the substrate, wherein the nitrogen based plasma produces a nitrogen containing layer on one of the first conductivity region and the second conductivity region, and the nitrogen based plasma removes the remaining portion of the photoresist layer on the other of the first conductivity region and the second conductivity region, wherein the nitrogen based plasma produces substantially no carbon residue and no interfacial growth.

In one embodiment, the first conductivity region provides the site for at least one subsequently formed pFET device and the second conductivity region provides the site for at least one subsequently formed nFET device, wherein removing the first portion of the photoresist layer exposes the portion of high-k dielectric material corresponding to the subsequently formed pFET device and the remaining portion of the photoresist layer is present overlying the portion of the high-k dielectric material corresponding to the subsequently formed nFET device. In another embodiment, the first conductivity region provides the site for at least one subsequently formed nFET device and the second conductivity region provides the site for at least one subsequently formed pFET device.

In another embodiment, the inventive process removes the photoresist from atop a metal gate conductor of a gate structure of a MOS device. In one embodiment, the method includes:

providing a substrate including a semiconducting device region, a high-k dielectric material present atop the semiconducting device region, and a metal gate conductor atop the high-k dielectric material, applying a photoresist layer atop the metal gate conductor;

patterning the photoresist layer to provide an etch mask overlying a portion of the metal gate conductor corresponding to a gate stack; etching the metal gate conductor and the high-k dielectric material selective to the etch3 mask; and removing the etch mask with a substantially oxygen free nitrogen based plasma.

In one embodiment, the semiconducting region includes at least one nFET device. In another embodiment, the semiconducting region includes at least one pFET device.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1:
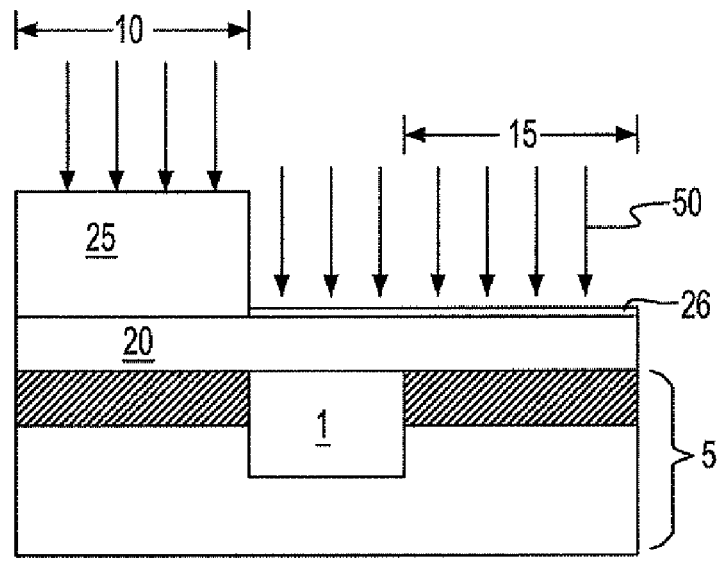
FIG. 1 is a side cross sectional view depicting one embodiment of a process that includes a nitrogen based plasma to remove a photoresist layer from a first conductivity region and to apply a nitridation process to a high-k dielectric material present in a second conductivity region, in accordance with the present invention.

The present invention, which in one embodiment provides a method for forming gate structures to semiconducting devices, including but not limited to gate structures to field effect transistors (FET) having a metal gate conductor/high-k dielectric stack, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention. When describing the methods and structures of the present invention, the following terms have the following meanings, unless otherwise indicated.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor classify it as either an n-type or p-type semiconductor.

As used herein, the terms "conductivity type" and "conductivity region" denote a p-type or n-type doped semiconductor.

As used herein, a "P-type" refers to the addition of impurities to an intrinsic semiconductor that creates deficiencies of valence electrons, such as the addition of boron, aluminum, or gallium to a type IV semiconductor, such as silicon.

As used herein, an "N-type" refers to the addition of impurities to an intrinsic semiconductor that contribute free elections, such as the addition of antimony, arsenic, or phosphorous to a type IV semiconductor, such as silicon.

As used herein a "field effect transistor (FET)" is a transistor in which output current, i.e., source-drain current, is controlled by the voltage applied to the gate. A field effect transistor has three terminals, i.e., a gate, a source and a drain.

As used herein, the term "drain" means a doped region in semiconductor substrates located at the end of the channel in field effect transistors (FET); in which carriers are flowing out of the transistor through the drain.

As used herein, the term "source" is a doped region from which majority carriers are flowing into the channel.

As used herein, the term "channel" is the region between the source and drain of a metal oxide semiconductor transistor that becomes conductive when the transistor is turned on.

A "gate structure" means a structure used to control output current (i.e., flow of carriers in the channel) of a semiconducting device, such as a field effect transistor (FET).

As used herein, the term "gate conductor" denotes a material having a bulk resistivity ranging from $10^{-4}$ Ω-cm to $10^{-6}$ Ω-cm, which is positioned overlying a gate dielectric.

As used herein, a "pFET" refers to a field effect transistor having source/drain regions created by the addition of impurities, such as boron, aluminum or gallium to an intrinsic Si substrate, to create deficiencies of valence electrons to an intrinsic semiconductor.

As used herein, an "nFET" refers to a field effect transistor having source/drain regions created by created the addition of impurities that contribute free electrons to an intrinsic semiconductor, such as antimony, arsenic or phosphorous to an intrinsic silicon substrate.

As used herein, a "gate dielectric" is a layer of dielectric between the semiconductor device substrate and the gate conductor.

As used herein, the term "dielectric" denote a non-metallic material having insulating properties.

As used herein, "insulating" denotes a room temperature conductivity of less than about $10^{-10}(\Omega\text{-m})^{-1}$.

As used herein, "high K" denotes a dielectric material featuring a dielectric constant (k) higher than about 3.9.

The term "nitrogen based plasma" means a plasma process including a mixture of $H_2:N_2$ with no intentional introduction of oxygen or fluorine or any other species.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

Further, it will be understood that when an element as a layer, region or substrate is referred to as being "atop" or "over" or "overlying" or "below" or "underlying" another element, it can be directly on the other element or intervening elements may also be present. In contrast, when an element is referred to as being "directly on" or "directly over" of in "direct physical contact" with another element, there are no intervening elements present.

Reference is first made to FIG. 1, which depicts one embodiment of a process for treating a high-k dielectric material 20 (gate dielectric) including a nitrogen based plasma 50 that removes a photoresist layer 25 from a first conductivity region 10 and applies a nitridation process to a high-k dielectric material 20 of a second conductivity region 15. In one embodiment, the method includes providing a substrate 5 including a first conductivity region 10 and a second conductivity region 15, wherein a high-k dielectric material 20 is present atop the first conductivity region 10 and the second conductivity region 15; applying a photoresist layer 25 atop the first conductivity region 10 and the second conductivity region 15; removing a first portion of the photoresist layer 25 to expose the second conductivity region 15, wherein a remaining portion of the photoresist layer 25 remains overlying the first conductivity region 10; and applying a nitrogen based plasma 50 to the substrate 5, wherein the nitrogen based plasma 50 produces a nitrogen containing layer 26 on the second conductivity region 15, and the nitrogen based plasma 50 removes the remaining portion of the photoresist layer 25 on the first conductivity region 10, wherein the nitrogen based plasma 50 produces substantially no carbon residue.

In one embodiment, the first conductivity region 10 provides the site for a subsequently formed nFET device and the second conductivity region 15 provides the site for a subsequently formed pFET device, wherein removing the first portion of the photoresist layer exposes the portion of the high-k dielectric material 20 that is to be integrated. into the subsequently formed.pFET device. .1n another embodiment, the first conductivity region 10 provides the site for a subsequently formed pFET device and the second conductivity region 15 provides the site for a subsequently formed nFET device, wherein removing the first portion of the photoresist layer 25 exposes the portion of the high-k dielectric material 20 that is to be integrated into the subsequently formed nFET device.

In one embodiment, the substrate 5 employed in the present invention may be any semiconducting material including, but not limited to: Si, Ge, SiGe, SiC, SiGeC,Ga, GaAs, InAs, InP and all other III/V or II/VI compound semiconductors. The substrate 5 may also comprise an organic semiconductor or a layered semiconductor such as Si/SiGe, a silicon-on-insulator (SOI) or a SiGe-on-insulator (SGOI). In some embodiments of the present invention, the substrate 5 is composed of a Si-containing semiconductor material, i.e., a semiconductor material that includes silicon. The substrate 5 may be doped, undoped or contain doped and undoped regions therein.

The substrate 5 may also include a first doped (n- or p-) region, and a second doped (n- or p-) region. For clarity, the doped regions are not specifically shown in the drawing of the present application. The first doped region and the second doped region may be the same, or they may have different conductivities and/or doping concentrations. These doped regions are known as "wells".

In one embodiment, at least one isolation region 1 is typically present within the substrate 5. The at least one isolation region 1 may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region 1 provides isolation between neighboring first conductivity regions 10 and second conductivity regions 15, typically required when the neighboring gates have opposite conductivities. In one embodiment the neighboring conductivity regions can have the same conductivity (i.e., both n- or p-type), or alternatively they can have different conductivities (i.e., one n-type and the other p-type). In one embodiment, a semiconducting region is defined by the portion of the substrate 5 that is positioned between two isolation regions 1.

Still referring to FIG. 1, after forming the at least one isolation region 1 within the substrate 5, a high-k dielectric material 20 is formed on a semiconducting surface of the substrate 5. In one embodiment, the high-k dielectric material 20 is formed atop the first conductivity region 10 and the second conductivity region 15 of the substrate 5. In one embodiment, the high-k dielectric material 20 is formed by a thermal growth process, such as, for example, oxidation, nitridation or oxynitridation. In another embodiment, the high-k dielectric material 20 is formed by a deposition process such as, for example, chemical vapor deposition (CVD), plasma-assisted CVD, metal organic chemical vapor deposition (MOCVD), atomic layer deposition (ALD), evaporation, reactive sputtering, chemical solution deposition and other like deposition processes. The high-k dielectric material 20 may also be formed utilizing any combination of the above processes.

In one embodiment, the high-k dielectric material 20 is comprised of an insulating material having a dielectric constant of greater than about 4.0. In one embodiment, the high-k dielectric material 20 has a dielectric constant greater than about 7.0. Specifically, the high-k dielectric material 20 employed in the present invention includes, but not limited to: an oxide, nitride, oxynitride and/or silicate including metal silicates and nitrided metal silicates. In one embodiment, the high-k dielectric material 20 is composed of $HfO_2$, hafnium silicate and hafnium silicon oxynitride. In another embodiment, the high-k dielectric material 20 is comprised of an oxide, such as, for example, $ZrO_2$, $Al_2O_3$, $TiO_2$, $La_2O_3$, $SrTiO_3$, $LaAlO_3$, $Y_2O_3$ and mixtures thereof.

The physical thickness of the high-k dielectric material 20 may vary, but in one embodiment of the present invention, the high-k dielectric material 20 has a thickness ranging from about 0.5 nm to about 10 nm, with a thickness from about 0.5 to about 3 nm being more typical. It may be deposited above a thin (on the order of about 0.1 to about 1.5 nm) layer of silicon oxide or silicon oxynitride that is first deposited on the substrate 5. In some instances an additional dielectric layer can be located between the high-k dielectric material 20 and the substrate 5, such as a nitride layer.

Following the formation of the high-k dielectric material 20, a photoresist layer 25 is formed atop the high-k dielectric material 20 on the first conductivity region 10 and the second conductivity region 15 of the substrate 5. The photoresist layer 25 can be either positive-acting or negative-acting. For most negative-acting photoresists, those coating layer portions that are exposed to an activating radiation polymerize or cross-link in a reaction between a photoactive compound and polymerizable agents of the photoresist composition. Consequently, the exposed coating portions are rendered less soluble in a developer solution than unexposed portions. For positive-acting photoresists, exposed portions are rendered more soluble in a developer solution while areas not exposed remain comparatively less developer soluble.

In general, photoresist compositions include at least a resin binder component and a photoactive agent. A wide variety of polymeric or resin binders may be used in photoresists. Such polymeric binders may include, as polymerized components, one or more acid functional monomers such as acrylic acid or methacrylic acid.

In one embodiment, the photoresist layer 25 is composed of DQN photoresist. DQN photoresist is a two component photoresist that includes diazoquinone (DQ)-photosensitive component) and novolac (N-resin). Typically, the diazoquinone is the photosensitive component and the novolac is not sensitive enough for <300 nm exposure wavelength; common with g-line (436 nm) and i-line (365 nm) exposure tools. The photoresist may be either liquid or dry film. Liquid photoresists are dispensed on a substrate and then cured. Dry film photoresists are typically laminated to a substrate. In one embodiment, the photoresist layer 25 is deposited using spin-on techniques.

Following formation of the photoresist layer 25 atop the first conductivity region 10 and the second conductivity region 15 of the substrate 5, the photoresist layer 25 is patterned using photolithography and developed. More specifically, in one embodiment, a pattern is produced by exposing the photoresist layer 25 to a pattern of radiation, and then developing the pattern into the photoresist utilizing conventional resist developer, such as a chemical solvent. In a positive resist development, the developer leaves a hole in the resist layer that corresponds to the opaque pattern of a reticle (mask) of the photolithography tool. In negative resist development, the developer leaves a pattern in the resist opposite to that on the reticle (mask). Development of the pattern is conducted using conventional development techniques including, but not limited to: continuous spray development and puddle development.

In one embodiment, following development of the patterned photoresist layer one of the first conductivity region 10 and the second conductivity region 15 is exposed, wherein a remaining portion of the photoresist layer 25 remains overlying the other of the first conductivity region 10 or the second conductivity region 15. It is noted that although FIG. 1 depicts the remaining portion of the photoresist layer 25 overlying the first conductivity region 10, the method of the present invention is equally applicable to where the remaining portion of the photoresist layer 25 is positioned overlying the second conductivity region 15.

Still referring to FIG. 1, the nitrogen based plasma 50 is then applied to the first conductivity region 10 and the second conductivity region 15 of the substrate 5, wherein the nitrogen based plasma 50 produces a nitrogen containing layer 26 on the exposed second conductivity region 15 and the nitrogen based plasma 50 removes the remaining portion of the photoresist layer 25 on the first conductivity region 10. More specifically, in one embodiment, the nitrogen based plasma 50 simultaneously removes the remaining portion of photoresist 25 and nitrides the exposed portion of the high-k dielectric material 20 that is present in the exposed conductivity region, hence providing control over the selectivity of the nitridation process. In one embodiment when the remaining portion of the photoresist layer 25 is present over the conductivity region in which nFET devices are subsequently formed, the nitride based plasma 50 nitrides the portion of the high-k dielectric material 20 present in the conductivity region in which the pFET devices are subsequently formed. In another embodiment when the remaining portion of the photoresist layer 25 is present over a conductivity region in which pFET devices are subsequently formed, the nitride based plasma nitrides the high-k dielectric material 20 in the conductivity region in which the nFET devices are subsequently formed.

In one embodiment, the nitrogen based plasma 50 produces substantially no carbon residue on the surface of the high-k dielectric material 20. A typical source of carbon in prior techniques is photo-resist residue. The present invention in one embodiment can achieve no carbon residue. The present invention in one embodiment can achieve no carbon residue by removing the photoresist using a nitrogen based plasma process. Oxygen asking as typically practiced results in interfacial growth, i.e, oxide growth in high-k metal gate stakes. The present nitrogen plasma does not result in interfacial growth, because it does not introduce oxygen to the gate stacks and completely removes the photoresist, therefore completely removing any carbon.

In one embodiment, the nitrogen based plasma 50 is composed of $N_2$:$H_2$. In one embodiment, the nitrogen based plasma 50 is composed of about 1% to about 10% of $H_2$ in $N_2$:$H_2$ and is substantially free of $O_2$. In one embodiment, the $O_2$ content of the nitrogen based plasma 50 is less than about 0.01wt %. In another embodiment, the $O_2$ content of the nitrogen based plasma 50 is less than about 0.5 wt %. In another embodiment, the nitrogen based plasma 50 is completely devoid of $O_2$.

In one embodiment, the fluoride content of the nitrogen based plasma 50 is approximately 0%. In another embodiment, the nitrogen based plasma 50 is completely devoid of fluoride.

In one embodiment, the flow rate of the nitrogen based plasma 50 ranges from about 2,000 sccm to about 11,000 sccm. In another embodiment, the flow rate of the nitrogen based plasma 50 ranges from about 8,000 sccm to about 10,000 sccm.

In one embodiment, the RF power of the nitrogen based plasma 50 ranges from about 1,000 W to about 3,000 W. In another embodiment, the RF power of the nitrogen based plasma 50 ranges from about 1,500 W to about 2,500 W. In an even further embodiment, the RF power of the nitrogen based plasma ranges 50 from about 500 W to about 5000 W.

In one embodiment, the temperature during the application of the nitrogen based plasma 50 ranges from about room temperature to about 300° C. In another embodiment, the temperature during the application of the nitrogen based plasma 50 ranges 50 from about 25° C. to about 350° C. In a further embodiment, the temperature during the application of the nitrogen based plasma ranges 50 from about 100° C. to about 300° C.

In one embodiment, following the application of the of the nitrogen based plasma 50, the first conductivity region 10 and the second conductivity region 15 are processed to provide semiconducting devices. In one embodiment, the high-k dielectric material 20 provides the gate dielectric of a gate structure to a field effect transistor (FET). For example, in one embodiment field effect transistors (FETs) are formed including gate structures including metal gate conductors atop the high-k dielectric material 20. In one embodiment, an nFET is formed including a metal gate conductor composed of titanium nitride (TiN) and a high-k dielectric material 20 composed of hafnium oxide ($HfO_2$), wherein a layer of aluminum oxide ($Al_2O_3$) may be present at the interface of the metal gate conductor and the high-k dielectric material 20. In another embodiment, the nFET includes a metal gate conductor composed of tungsten nitride (WN) and a high-k dielectric material 20 composed of $HfO_2$. In one embodiment, a pFET is formed including a metal gate conductor composed of titanium nitride (TiN) and a high-k dielectric material 20 composed of hafnium oxide ($HfO_2$), wherein a layer of tantalum oxide (TaO) may be present at the interface of the metal gate conductor and the high-k dielectric material 20.

Figure 2:
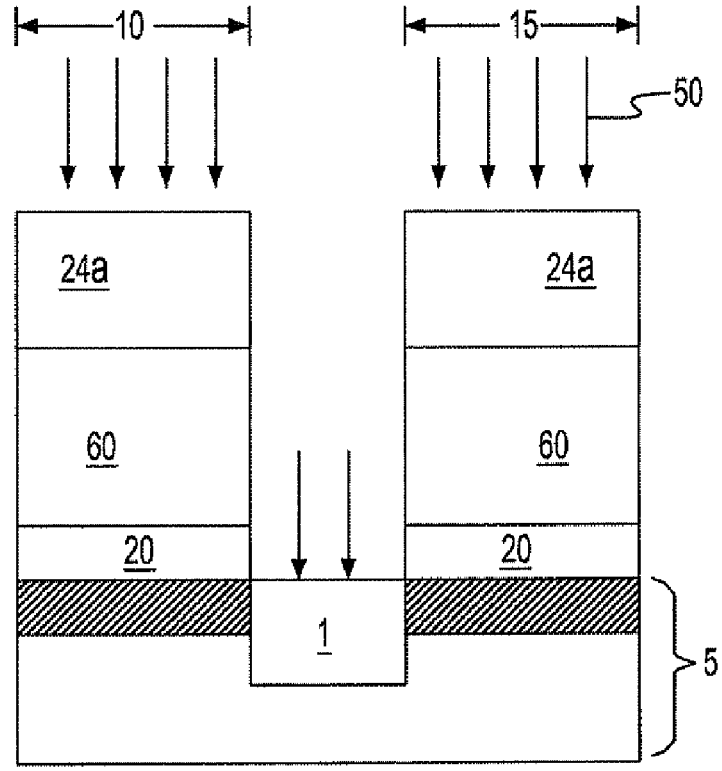
FIG. 2 is a side cross sectional view depicting one embodiment of a process that includes a nitrogen based plasma to remove a photoresist layer from a gate structure including a high k dielectric material and a metal gate conductor, in accordance with the present invention.

Referring to FIG. 2, in another embodiment, the above-described nitrogen based plasma 50 is utilized to remove a photoresist mask 24a, wherein the photoresist mask 24a was utilized to from a gate structure including a gate dielectric composed of a high-k dielectric material 20 and metal gate conductor 60. In one embodiment, the high-k dielectric material 20 is formed atop a substrate 5 including a first conductivity region 10 and a second conductivity region 15, using similar methods as described above with reference to FIG. 1.

Following the formation of the high-k dielectric material 20, a metal gate conductor 60 is formed atop the high-k dielectric material 20 using a deposition process to provide a layered stack composed of the high-k dielectric material 20 atop the substrate 5, and the metal gate conductor 60 atop the high-k dielectric material 20. In one embodiment the metal gate conductor 60 is deposited by physical vapor deposition (PVD), e.g., sputtering or plating. In one embodiment, the metal gate conductor 60 is composed of TaN, W, WN, Ti, TiN or combinations thereof. In one embodiment, the metal gate conductor 60 has a thickness ranging from about 1 mn to about 50 nm.

In a following process step, layered stack of the metal gate conductor 60/high-k dielectric material 20 is patterned and etched to provide gate structures corresponding to the first conductivity region 10 and second conductivity region 15 of the substrate. More specifically, a layer of photoresist is deposited atop the entire structure. The photoresist layer is then selectively patterned and developed to provide an photoresist mask (etch mask) 24a protecting the portion of layered stack of the metal gate conductor 60/high-k dielectric material 20 corresponding to the subsequently formed gate stacks, and exposing at least one second region of the metal gate conductor 60. The exposed regions of the layered stack of the metal gate conductor 60/high-k dielectric material 20 are then etched, while the regions underlying the photoresist mask 24a are protected to provide the gate stacks corresponding to FET devices. Following formation of the gate stacks, the photoresist mask 24a is removed by the nitrogen based plasma 50.

It is noted that multiple sequences of the above-described processing may be utilized to provide a device, in which the first conductivity region 10 includes a gate stack having metal gate conductor 60/high-k dielectric material 20 combination that is different from the combination of the metal gate conductor 60/high-k dielectric material 20 combination of the gate stack in the second device region 15. For example, in one embodiment, the first conductivity device region 10 may be processed to provide an nFET including a metal gate conductor 60 composed of titanium nitride (TiN) and a high-k dielectric material 20 composed of hafnium oxide ($HfO_2$), wherein a layer of aluminum oxide ($Al_2O_3$) may be present at the interface of the metal gate conductor 60 and the high-k dielectric material 20; and the second conductivity device region 15 may be processed to provide a pFET including a metal gate conductor 60 composed of titanium nitride (TiN) and a high-k dielectric material 20 composed of hafnium oxide ($HfO_2$), wherein a layer of tantalum oxide (TaO) may be present at the interface of the metal gate conductor 60 and the high-k dielectric material 20.

In one embodiment, the present invention provides a nitrogen based plasma 50 that may be used to strip photoresist 24a from a high-k dielectric material 20, such as $HfO_2$, wherein the nitrogen based plasma 50 is substantially $O_2$ free and substantially minimizing interfacial re-oxidation of the gate dielectric. In a further embodiment, the nitrogen based plasma 50 may be utilized to nitridize the high-k dielectric material 20 leading to the Tinv (electrical thickness) scaling, Toxgl improvement (gate leakage) due to increase in dielectric constant of the dielectric gate stack, and defect reduction due to passivation on dangling bonds at interfaces and the bulk gate dielectric. The following example is provided to further illustrate and demonstrate some advantages of the present invention.

EXAMPLE

FET test samples (20 µm ×10 µm) 100 where prepared from a high-k dielectric ($HfO_2$) that was deposited on a pre-cleaned silicon substrate, wherein a photoresist layer was spun onto the high-k dielectric and baked. The photoresist layer was removed from the FET test sample 100 using a nitrogen based plasma, in accordance with the present invention. A control sample 105 was prepared using similar processing as the FET test sample 100, but for the photoresist layer being removed from the control sample 105 using oxygen ashing. Electric thickness (Tinv) numbers were extracted from high frequency CV's in inversion and drain current—gate voltage (Id-Vg) measurements at 50 mV drain bias are used to extract Vt's. Leakage parameter (Toxgl) is defined as the theoretical $SiO_2$ thickness, which would have the same gate leakage as the dielectric understudy.

Figure 3:
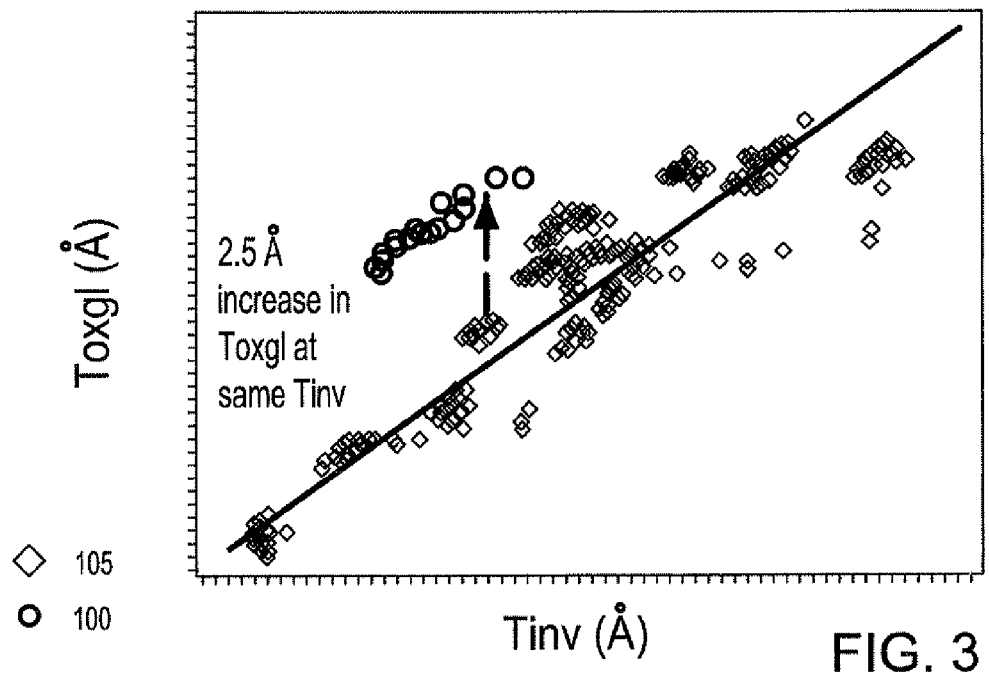
FIG. 3 is a plot of a leakage parameter (Toxgl) (the equivalent $SiO_2$ thickness that would result in the same gate leakage current as high-k gate dielectric material) as a function of electric thickness (Tinv)(Inversion Thickness) for test samples processed to remove a photoresist using the nitrogen based plasma, in accordance with the present invention, in comparison with a control sample that is processed using oxygen ashing to remove the photoresist.

FIG. 3 plots the leakage parameter (Toxgl) as a function of electric thickness (Tinv). FIG. 3 clearly illustrates that the nitrogen based plasma that is applied to the FET test specimen 100 to remove the photoresist nitrides the high-k dielectric layer, hence increasing the leakage parameter (Toxgl) values of the FET test sample 100 to on the order of about 2.5 Å higher than the control sample 105, from which the photoresist was removed using oxygen ashing.

Figure 4:
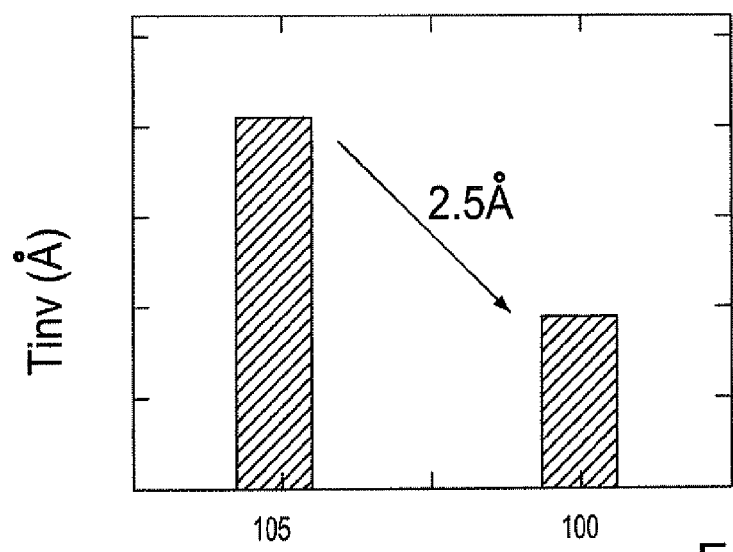
FIG. 4 is a plot illustrating the electrical thickness (Tinv) of test sample including a gate dielectric processed to remove a photoresist using a nitrogen based plasma, in accordance with the. present invention, in comparison to a control sample that is processed using oxygen ashing to remove the photoresist.

FIG. 4 compares the electric thickness (Tinv) between the control sample 105 and the FET test sample 100. It is clearly seen that the FET test sample 100 utilizing the inventive nitrogen based plasma provides significant scaling with respect to the control sample 105.

Figure 5:
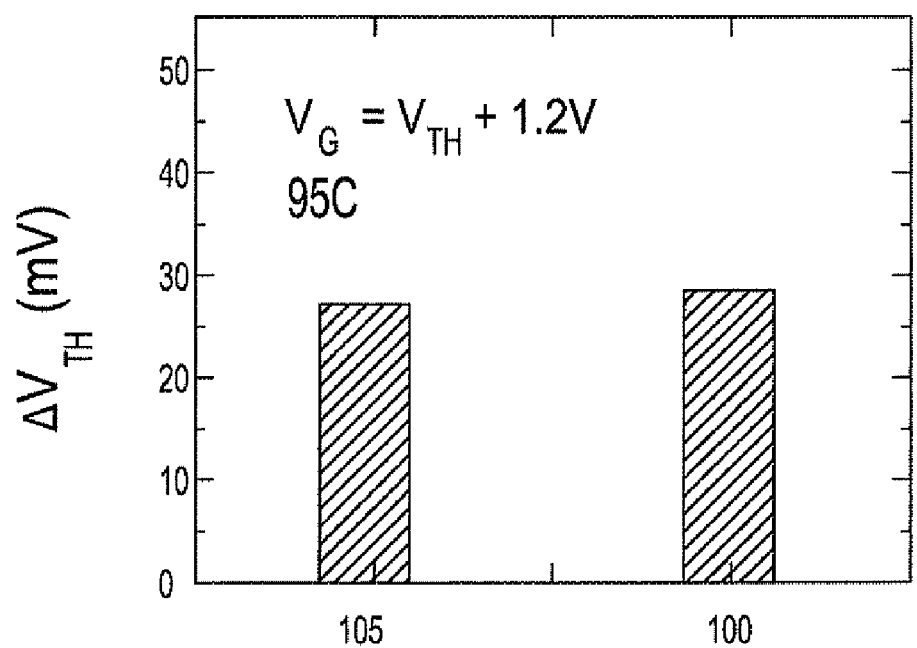
FIG. 5 is a plot illustrates a threshold voltage shift after 100 seconds of stress applied to a FET processed using a nitrogen based plasma, in accordance with the present invention, in comparison to a control sample.

To further estimate the effect of the nitrogen based plasma processing, the samples 100, 105 were also stressed at Vg=Vt+1.2V, 95° C. FIG. 5 illustrates a threshold voltage shift after 100 seconds of stress plotted for the FET test sample 100 and a control sample 105. The threshold voltage shift between the two samples is comparable. This experimentation, indicates the novel nitrogen based plasma process does not introduce defects in the gate dielectric stack.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed as new is:

1. A method of processing a high-k dielectric material comprising:

providing a substrate including a first conductivity region and a second conductivity region, wherein a high-k dielectric material is present atop the first conductivity region and the second conductivity region;

applying a photoresist layer atop the first conductivity region and the second conductivity region;

removing a first portion of the photoresist layer and the high-k dielectric material to expose one of the first conductivity region and the second conductivity region, wherein a remaining portion of the photoresist layer remains overlying an other of the first conductivity region and the second conductivity region; and applying a nitrogen based plasma to the substrate, wherein the nitrogen based plasma produces a nitrogen containing layer on one of the first conductivity region and the second conductivity region, and the nitrogen based plasma removes the remaining portion of the photoresist layer on the other of the first conductivity region and the second conductivity region, wherein the nitrogen based plasma produces substantially no carbon residue and no interfacial growth.

2. The method of claim 1, wherein the first conductivity region is processed to provide at least one pFET device and the second conductivity region is processed to provide at least one nFET device, wherein removing the first portion of the photoresist layer exposes a portion of the high-k dielectric material corresponding to the at least one pFET device, and the remaining portion of the photoresist layer is present corresponding to the at least one nFET device.

\* \* \* \* \*